United States Patent
Okada (10) Patent No.: US 12,459,075 B2
(45) Date of Patent: Nov. 4, 2025

(54) SEMICONDUCTOR MANUFACTURING DEVICE

(71) Applicant: Kioxia Corporation, Tokyo (JP)

(72) Inventor: Yasuhide Okada, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 469 days.

(21) Appl. No.: 17/874,636

(22) Filed: Jul. 27, 2022

(65) Prior Publication Data

US 2023/0294238 A1    Sep. 21, 2023

(30) Foreign Application Priority Data

Mar. 15, 2022 (JP) .................................. 2022-039794

(51) Int. Cl.
| | |
|---|---|
| *B24B 37/10* | (2012.01) |
| *B24B 37/005* | (2012.01) |
| *H01L 21/67* | (2006.01) |

(52) U.S. Cl.
CPC ............ *B24B 37/10* (2013.01); *B24B 37/005* (2013.01); *H01L 21/67253* (2013.01)

(58) Field of Classification Search
CPC ..... B24B 1/002; B24B 37/013; B24B 37/005; B24B 37/042; B24B 37/10; B24B 37/24; B24B 37/32; B24B 37/205; B24B 49/003; B24B 49/10; H01L 21/67253; G01N 29/14; F16F 15/00; F16F 15/02; F16F 15/021; F16F 15/022
USPC ...................................................... 451/5, 41
See application file for complete search history.

(56) References Cited

U.S. PATENT DOCUMENTS

| | | | | |
|---|---|---|---|---|
| 5,476,414 A | * | 12/1995 | Hirose | .............. H01L 21/02024 |
| | | | | 451/388 |
| 6,336,945 B1 | * | 1/2002 | Yamamoto | ............... C09G 1/02 |
| | | | | 106/3 |
| 2003/0087586 A1 | | 5/2003 | Kaushal et al. | |
| 2016/0013085 A1 | | 1/2016 | Chew et al. | |
| | | (Continued) | | |

FOREIGN PATENT DOCUMENTS

| | | | | |
|---|---|---|---|---|
| CN | 111941282 A | * | 11/2020 | ........... B24B 49/003 |
| JP | S61215805 A | * | 9/1986 | |
| JP | 2017190971 A | * | 10/2017 | ......... B24B 37/0053 |

OTHER PUBLICATIONS

CN111941282—Machine Translation (Year: 2020).*

(Continued)

*Primary Examiner* — Brian D Keller
*Assistant Examiner* — Alberto Saenz
(74) *Attorney, Agent, or Firm* — Foley & Lardner LLP (57) ABSTRACT

A semiconductor manufacturing device includes: a turntable configured to be rotatable and having a first surface; a polishing pad provided on the first surface; a first support portion configured to rotatably hold the turntable; a top ring having a second surface and including a suction mechanism that holds an object to be processed on the second surface; a second support portion configured to rotatably hold the top ring; a first member to come into contact with the turntable or top ring; a second member to come into contact with the polishing pad or suction mechanism and with the turntable or top ring via the first member; and a first acoustic emission sensor to come into contact with the second member.

14 Claims, 6 Drawing Sheets

(56) References Cited

U.S. PATENT DOCUMENTS

2016/0207163 A1    7/2016  Matsui et al.
2017/0095901 A1*   4/2017  Nakamura ............ B24B 49/105
2021/0180628 A1*   6/2021  Yoen .................... F16B 37/061

OTHER PUBLICATIONS

JP2017190971—Machine Translation (Year: 2017).*
Author: Elsevier Title: Composite Part A Pub. Date: Feb. 2013 URL: https://www.sciencedirect.com/science/article/pii/S1359835X12003028 (Year: 2013).*
JPS61215805A—Machine Translation (Year: 1986).*

* cited by examiner

SEMICONDUCTOR MANUFACTURING DEVICE

CROSS-REFERENCE TO RELATED APPLICATION(S)

This application is based upon and claims the benefit of priority from Japanese Patent Application No. 2022-039794, filed Mar. 15, 2022, the entire contents of which are incorporated herein by reference.

FIELD

Embodiments described herein relate generally to a semiconductor manufacturing device.

BACKGROUND

When a surface of a wafer is to be polished, a polishing end point of a film is detected by a predetermined method. In a semiconductor manufacturing process, the accuracy required for polishing is increasing.

DETAILED DESCRIPTION

At least one embodiment provides a semiconductor manufacturing device capable of accurately determining a polishing end point.

In general, according to at least one embodiment, the semiconductor manufacturing device includes: a turntable configured to be rotatable and having a first surface; a polishing pad provided on the first surface; a first support portion configured to rotatably hold the turntable; a top ring having a second surface and including a suction mechanism that holds an object to be processed on the second surface; a second support portion configured to rotatably hold the top ring; a first member to come into contact with the turntable or top ring; a second member to come into contact with the polishing pad or suction mechanism and with the turntable or top ring via the first member; and a first AE sensor to come into contact with the second member.

Hereinafter, embodiments will be described with reference to the drawings. In the drawings, the same or similar parts are designated by the same or similar reference numerals.

First Embodiment

A semiconductor manufacturing device according to at least one embodiment includes: a turntable configured to be rotatable and having a first surface; a polishing pad provided on the first surface; a first support portion configured to rotatably hold the turntable; a top ring having a second surface and including a suction mechanism that holds an object to be processed on the second surface; a second support portion configured to rotatably hold the top ring; a first member to come into contact with the turntable; a second member to come into contact with the polishing pad or suction mechanism and with the turntable via the first member; and a first AE sensor to come into contact with the second member.

In the semiconductor manufacturing device of at least one embodiment, the first member, the second member, and the first AE sensor are provided on the turntable.

Figure 1:
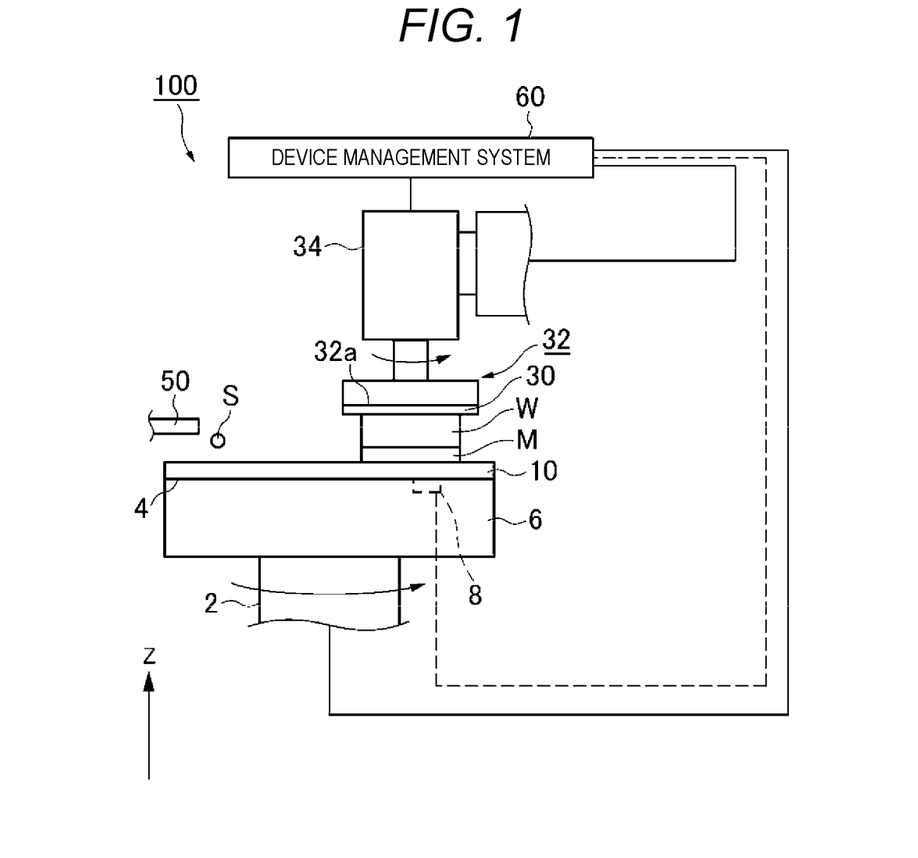
FIG. 1 is a schematic view of a semiconductor manufacturing device according to a first embodiment.
Figure 2:
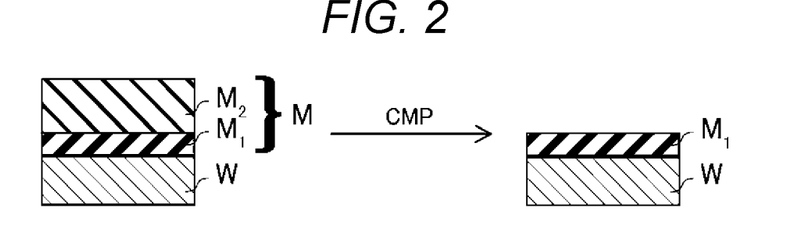
FIG. 2 is a schematic view for illustrating an example of a polishing end point of a film.
Figure 3:
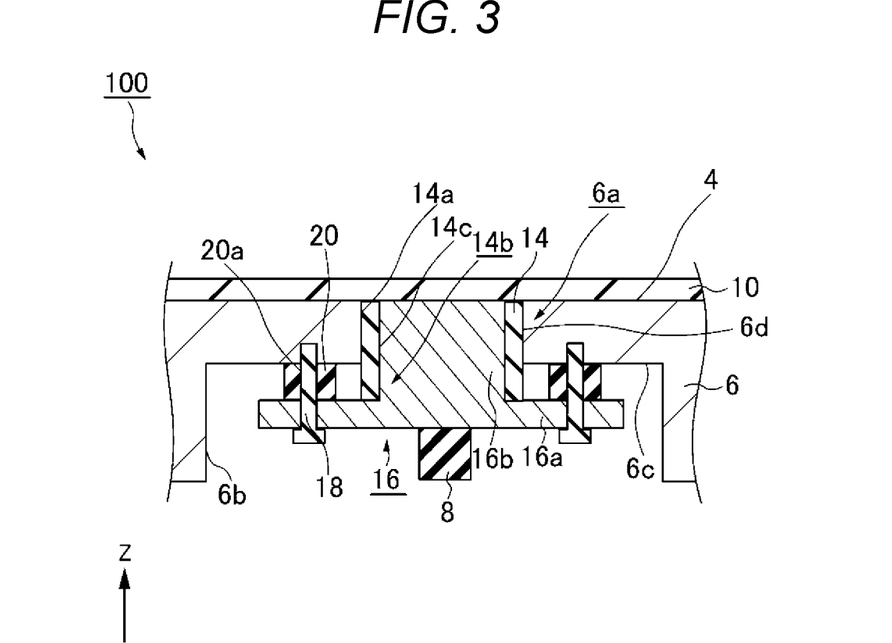
FIG. 3 is a schematic cross-sectional view of a main part of the semiconductor manufacturing device according to the first embodiment.

FIG. 1 is a schematic view of a semiconductor manufacturing device 100 according to at least one embodiment. FIG. 2 is a schematic view for illustrating an example of a polishing end point of a film. FIG. 3 is a schematic cross-sectional view of a main part of the semiconductor manufacturing device 100 according to the present embodiment.

The semiconductor manufacturing device 100 of the present embodiment includes a first support portion 2, a turntable 6, an AE sensor 8, a polishing pad 10, a first member 14, a second member 16, a fastening member 18, an anti-vibration mechanism 20, a top ring 32 including a suction mechanism 30, a second support portion 34, a slurry supply nozzle 50, and a device management system 60.

The semiconductor manufacturing device 100 of the embodiment is, for example, a device including a chemical mechanical polishing (CMP) device for chemically and mechanically polishing a film M formed on a wafer W and a system for controlling such a CMP device. In the semiconductor manufacturing device 100 of at least one embodiment, a plurality of CMP devices may be provided.

The wafer W is, for example, a semiconductor substrate. More specifically, the wafer W is, for example, a Si (silicon) substrate. The film M is formed on the surface of the wafer W. For example, the film M includes, as illustrated in FIG. 2, a film $M_1$ and a film $M_2$. The film $M_1$ is, for example, a silicon nitride (SiN) film. The film $M_2$ is, for example, a tetraethyl orthosilicate (TEOS) film.

For example, the semiconductor manufacturing device (CMP device) 100 removes the film $M_2$ by CMP processing so as to expose the film $M_1$. In this case, for example, the film $M_2$ functions as a film to be polished, and the film $M_1$ functions as a stopper film. Ideally, the semiconductor manufacturing device (CMP device) 100 preferably ends the CMP processing when the removal of the film $M_2$ is completed. That is, it is preferable that an interface between the film $M_2$ as the film to be polished and the film $M_1$ as the stopper film is the polishing end point. The semiconductor manufacturing device 100 of at least one embodiment is used, for example, for determining such a polishing end point.

The configuration of the film M to which the semiconductor manufacturing device 100 of the embodiment is applied is not limited to the above case. For example, materials constituting the film $M_1$ and the film $M_2$ are not limited to those described above. Moreover, in FIG. 2, the film $M_1$ is illustrated as being thicker than the film $M_2$, but the actual dimensions are not limited to that case. Furthermore, in FIG. 2, the wafer W, the film $M_1$ and the film $M_2$ are illustrated as having planar shapes, respectively, but the actual shapes are not limited to that case. For example, an interface between the wafer W and the film $M_1$ and the interface between the film $M_1$ and the film $M_2$ may be configured to have irregularities rather than being flat. Further, another film (not illustrated) may be provided between the film $M_1$ and the wafer W.

Here, a Z axis is defined. A Z direction parallel to the Z axis is, for example, a direction opposite to the vertical direction. The horizontal plane is, for example, a plane perpendicular to the Z axis.

The turntable 6 is a table that can be rotated, for example, in the horizontal plane by, for example, a motor (not illustrated).

The turntable 6 includes a first surface 4. The first surface 4 is an upper surface of the turntable 6. The first surface 4 is, for example, a surface parallel to the horizontal plane.

The polishing pad 10 is provided on the first surface 4. The polishing pad 10 is used for polishing the film M. The polishing pad 10 is, for example, a pad made of polyurethane. However, the material of the polishing pad 10 is not limited to this case.

The slurry supply nozzle 50 is provided above the polishing pad 10. The slurry supply nozzle 50 supplies slurry S used for polishing to the polishing pad 10.

The first support portion 2 is provided under the turntable 6. The first support portion 2 is connected to the turntable 6. The first support portion 2 rotatably holds the turntable 6. For example, the first support portion 2 is connected to a motor or the like (not illustrated). The first support portion 2 and the turntable 6 can be rotated in the horizontal plane by such a motor or the like.

The top ring 32 is provided above the turntable 6. The top ring 32 includes a second surface 32a. The second surface 32a is a lower surface of the top ring 32. The top ring 32 includes the suction mechanism 30 that holds the wafer W to be processed on the second surface 32a. The suction mechanism 30 is a mechanism that holds the wafer W to be processed by, for example, suctioning gas between the wafer W and the suction mechanism 30.

The second support portion 34 is provided above, for example, the top ring 32. The second support portion 34 rotatably holds the top ring 32. For example, the second support portion 34 is connected to a motor or the like (not illustrated). The second support portion 34 and the top ring 32 can be rotated in the horizontal plane by such a motor or the like.

The first member 14 is provided in the turntable 6. The first member 14 is in contact with the turntable 6. The first member 14 preferably contains a first insulating material having an electric conductivity of $10^{-6}$ S/m or less.

For example, the turntable 6 includes a first recess part 6b on a lower side of the turntable 6. A third surface 6c, which is an upper surface of the first recess part 6b, is a surface facing the first surface 4. For example, the third surface 6c is a surface parallel to the horizontal plane. Nevertheless, the third surface 6c does not have to be a surface parallel to the horizontal plane.

For example, the turntable 6 includes a second through hole 6a through which the third surface 6c and the first surface 4 communicate with each other. A part of the first member 14 is provided in the second through hole 6a. For example, an outer surface 14a of the first member 14 and a side surface (inner side surface) 6d of the second through hole 6a are in contact with each other. Accordingly, the first member 14 and the turntable 6 are in contact with each other. The form of contact between the first member 14 and the turntable 6 is not limited to the above case.

The second member 16 is in contact with the polishing pad 10. The second member 16 is also in contact with the turntable 6 via the first member 14.

For example, the first member 14 includes a third through hole 14b.

For example, the second member 16 includes a first portion 16a and a second portion 16b provided above the first portion 16a and having a diameter smaller than the diameter of the first portion 16a.

For example, an inner side surface 14c of the third through hole 14b is in contact with the second portion 16b. In this way, the second member 16 is in contact with the first member 14. The second member 16 is in contact with the turntable 6 via the first member 14.

For example, the second portion 16b of the second member 16 is in contact with the polishing pad 10.

The second member 16 is made of, for example, metal. The second member 16 is formed of, for example, stainless used steel (SUS). A damping coefficient of the second member 16 is preferably 0.3 dB/(MHz·cm) or less.

The second member 16 is fixed to the turntable 6 with the fastening member 18. For example, the fastening member 18 fixes, for example, the first portion 16a of the second member 16 to the third surface 6c of the turntable 6. The fastening member 18 is, for example, a bolt. However, the fastening member 18 may be a rivet, for example. The fastening member 18 includes a second insulating material. Here, the second insulating material is, for example, fiber reinforced plastics (FRP), but is not limited thereto.

The acoustic emission (AE) sensor 8 (an example of the first AE sensor) is in contact with the second member 16. The AE sensor 8 converts the vibration generated in the wafer W by polishing the wafer W into an electric signal via the polishing pad 10 and the second member 16 and measures the electric signal. For example, the electrical signal measured by the AE sensor 8 changes when the removal of the film $M_2$ as the film to be polished is completed. At this stage, the semiconductor manufacturing device 100 finishes the polishing.

The anti-vibration mechanism 20 includes a first through hole 20a through which the fastening member 18 penetrates. The anti-vibration mechanism 20 is provided, for example, between the third surface 6c of the turntable 6 and the first portion 16a of the second member 16. In this way, the anti-vibration mechanism 20 is fixed between the third surface 6c and the first portion 16a by the fastening member 18 penetrating the first through hole 20a. The anti-vibration mechanism 20 includes, for example, rubber. Here, as the rubber, one kind or a combination of two or more kinds of natural rubber, synthetic rubber, silicone rubber, urethane rubber and sponge rubber is preferably used. The type of the material used for the anti-vibration mechanism 20 is not limited to the above case.

It is preferable that the AE sensor 8 is in contact with the second member 16 provided in the first recess part 6b provided in the turntable 6.

The device management system 60 controls the polishing process by controlling rotation speeds of the first support portion 2 and the second support portion 34, controlling an amount of slurry S dropped from the slurry supply nozzle 50, and the like. The device management system 60 also measures and analyzes a signal measured by the AE sensor 8. The device management system 60 may be implemented by an electronic circuit, or may be implemented by combining hardware such as a computer and software such as a program.

Figure 4:
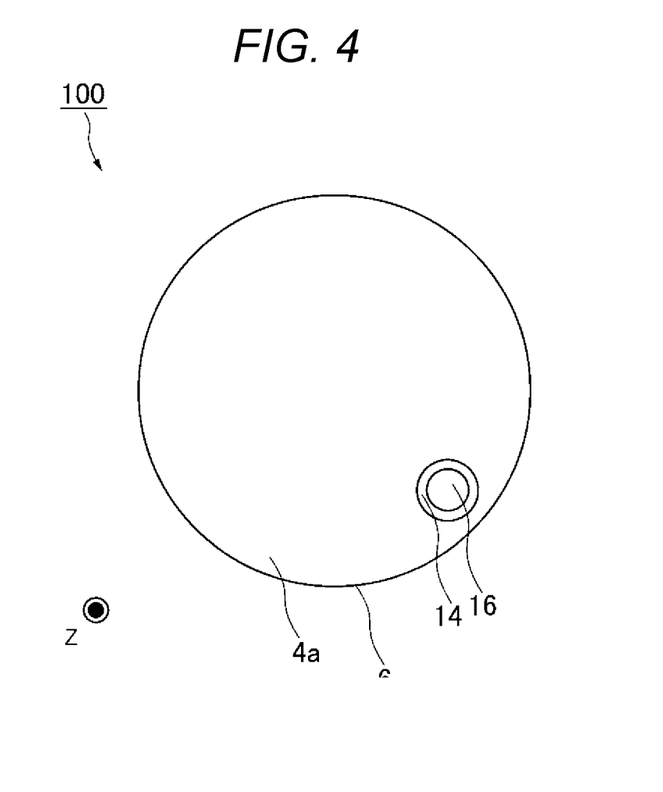
FIG. 4 is a schematic top view of the main part of the semiconductor manufacturing device according to the first embodiment.

FIG. 4 is a schematic top view of the main part of the semiconductor manufacturing device 100 according to at least one embodiment. The first surface 4a of the turntable 6, the first member 14, and the second member 16 are illustrated. In FIG. 4, the polishing pad 10, the top ring 32, and other members are not illustrated.

Next, the operation and effect of the semiconductor manufacturing device according to at least one embodiment will be described.

Figure 5:
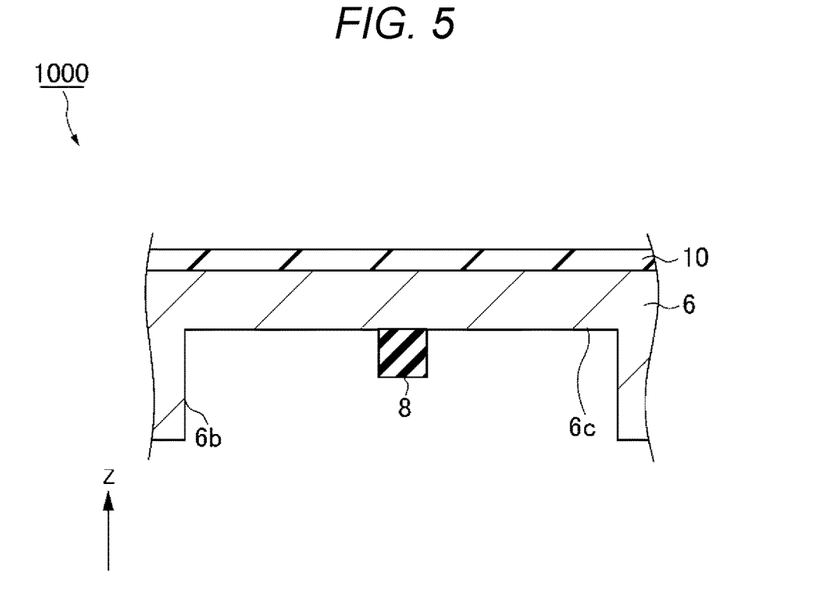
FIG. 5 is a schematic cross-sectional view of a main part of a semiconductor manufacturing device according to a comparative embodiment of the first embodiment.

FIG. 5 is a schematic cross-sectional view of a main part of a semiconductor manufacturing device 1000 according to a comparative embodiment of the embodiment. The AE sensor 8 is in contact with the third surface 6c of the first recess part 6b of the turntable 6.

As described above, the AE sensor 8 converts the vibration generated by polishing the wafer W into an electric signal and measures the electric signal. Here, the turntable 6 is often formed of a metal member (conductive member) such as SUS. There is a problem where, when a control signal or the like of the motor or the like reaches the AE sensor 8 as noise via such a metal member (conductive member), an S/N ratio of the electric signal generated by polishing the wafer W deteriorates, and the polishing end point may be erroneously detected.

Thus, the semiconductor manufacturing device 100 of at least one embodiment includes the first member 14 in contact with the turntable 6. The semiconductor manufacturing device 100 further includes the second member 16 in contact with the polishing pad 10 and also in contact with the turntable 6 via the first member 14. Thus, the AE sensor 8 is in contact with the second member 16.

The second member 16 is in contact with the polishing pad 10. Accordingly, the AE sensor 8 can measure, via the second member 16, the vibration generated by polishing the wafer W. The second member 16 is in contact with the turntable 6 via the first member 14. In other words, the second member 16 is not in direct contact with the turntable 6. As a result, the first member 14 hinders the arrival of the control signal or the like of the motor or the like to the AE sensor 8 via the turntable 6. This makes it possible to provide a semiconductor manufacturing device capable of accurately determining the polishing end point.

The first member 14 preferably contains a first insulating material having an electric conductivity of $10^{-6}$ S/m or less. The control signal or the like of the motor or the like is transmitted to the AE sensor 8 as electrical noise. Thus, when the first member 14 contains the above-mentioned insulating material, it is possible to hinder the transmission of the control signal or the like of the motor or the like.

The damping coefficient of the second member 16 is preferably 0.3 dB/(MHz·cm) or less. The second member 16 is required to transmit the vibration generated by polishing the wafer W to the AE sensor 8 via the polishing pad. When the damping coefficient is 0.3 dB/(MHz·cm) or less, the vibration generated by polishing the wafer W can be sufficiently transmitted to the AE sensor 8.

It is preferable that the second member 16 is fixed to the turntable 6 by the fastening member 18 including the second insulating material. Since the fastening member 18 contains the second insulating material, the transmission of the control signal or the like of the motor or the like from the turntable 6 to the second member 16 can be hindered.

The anti-vibration mechanism 20 containing rubber and having the first through hole 20a through which the fastening member 18 penetrates is provided, so that it is possible to hinder the vibration of the turntable 6 from being transmitted to the AE sensor 8.

It is preferable that the turntable 6 includes the third surface 6c facing the first surface 4 and the second through hole 6a through which the third surface 6c and the first surface 4 communicate with each other, a part of the first member 14 is provided in the second through hole 6a, and the second member 16 is in contact with the polishing pad 10 via the third through hole 14b of the first member 14. According to such an arrangement, it is possible to provide a semiconductor manufacturing device capable of accurately determining the polishing end point by hindering the transmission of the control signal or the like of the motor or the like.

It is preferable that the AE sensor 8 is in contact with the second member 16 provided in the first recess part 6b provided in the turntable 6. The vibration accompanying the polishing of the wafer W can be efficiently transmitted to the AE sensor by providing the first recess part 6b to reduce the thickness of the turntable 6 in the vicinity of the AE sensor 8.

According to the semiconductor manufacturing device of at least one embodiment, it is possible to provide a semiconductor manufacturing device capable of accurately determining a polishing end point.

Second Embodiment

A semiconductor manufacturing device according to the present embodiment includes: a turntable configured to be rotatable and having a first surface; a polishing pad provided on the first surface; a first support portion configured to rotatably hold the turntable; a top ring having a second surface and including a suction mechanism that holds an object to be processed on the second surface; a second support portion configured to rotatably hold the top ring; a first member to come into contact with the top ring; a second member to come into contact with the suction mechanism and with the top ring via the first member; and a first AE sensor to come into contact with the second member.

In the semiconductor manufacturing device of the present embodiment, the first member, the second member, and the first AE sensor are provided on the top ring. Here, the description of the same content with those of the first embodiment is omitted.

Figure 6:
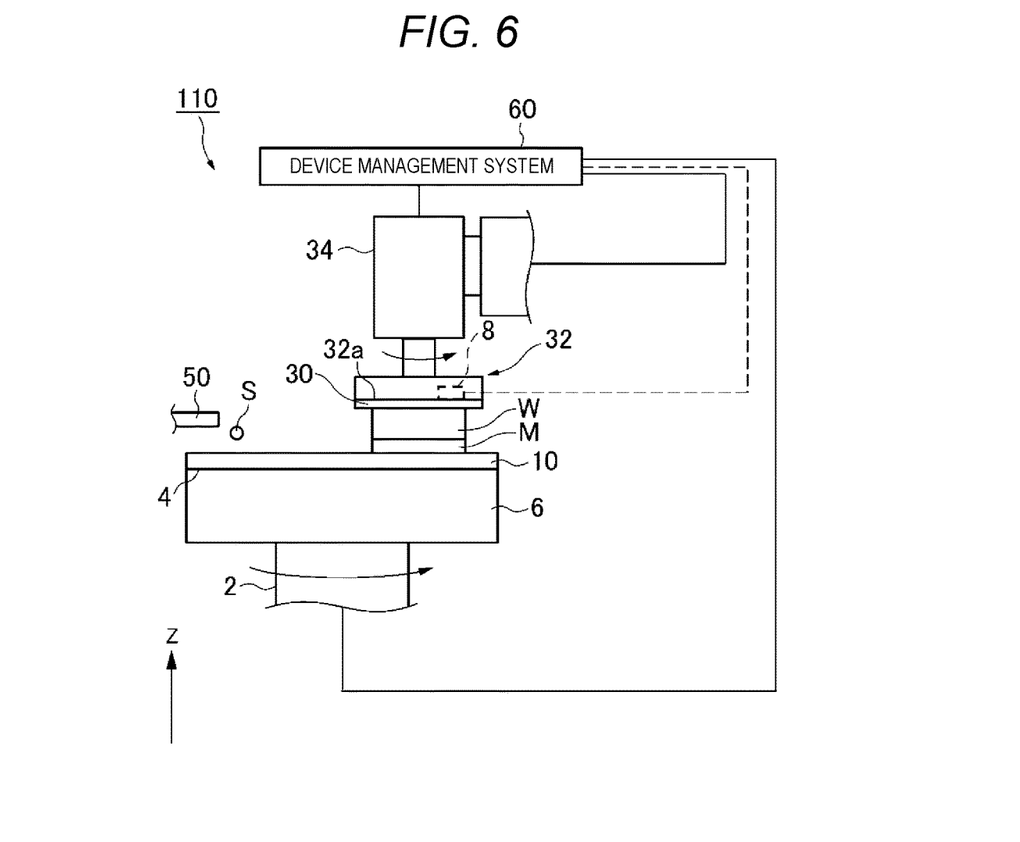
FIG. 6 is a schematic diagram of a semiconductor manufacturing device according to a second embodiment.

FIG. 6 is a schematic view of a semiconductor manufacturing device 110 according to the present embodiment. The AE sensor (an example of the first AE sensor) 8 is provided on the top ring 32.

Figure 7:
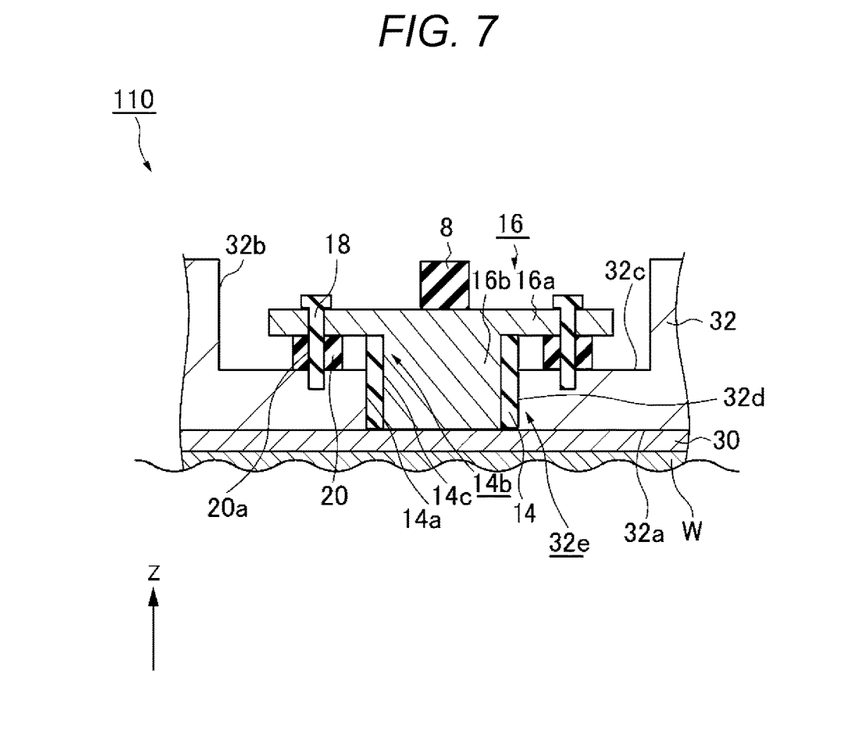
FIG. 7 is a schematic cross-sectional view of a main part of the semiconductor manufacturing device according to the second embodiment.

FIG. 7 is a schematic cross-sectional view of a main part of the semiconductor manufacturing device 110 according to the present embodiment. The first member 14 is provided on the top ring 32. The first member 14 is in contact with the top ring 32.

For example, the top ring 32 includes a second recess part 32b. A fourth surface 32c, which is a lower surface of the second recess part 32b, is a surface facing the second surface 32a. For example, the fourth surface 32c is a surface parallel to the horizontal plane. Nevertheless, the fourth surface 32c does not have to be a surface parallel to the horizontal plane.

For example, the top ring 32 includes a fourth through hole 32e through which the fourth surface 32c and the second surface 32a communicate with each other. A part of the first member 14 is provided in the fourth through hole 32e. For example, an outer surface 14a of the first member 14 and a side surface (inner side surface) 32d of the fourth through hole 32e are in contact with each other. Accordingly, the first member 14 and the top ring 32 are in contact with each other. The form of contact between the first member 14 and the top ring 32 is not limited to the above case.

The second member 16 is in contact with the suction mechanism 30. The second member 16 is in contact with the top ring 32 via the first member 14.

For example, the first member 14 includes a third through hole 14b.

For example, the second member 16 includes the first portion 16a and the second portion 16b provided under the first portion 16a and having a diameter smaller than the diameter of the first portion 16a.

For example, the inner side surface 14c of the third through hole 14b is in contact with the second portion 16b. In this way, the second member 16 is in contact with the first member 14. The second member 16 is in contact with the top ring 32 via the first member 14.

Further, for example, the second portion 16b of the second member 16 is in contact with the suction mechanism 30 via the third through hole 14b.

The second member 16 is fixed to the top ring 32 with the fastening member 18. For example, the fastening member 18 fixes the first portion 16a of the second member 16 to the fourth surface 32c of the top ring 32.

The acoustic emission (AE) sensor 8 (an example of the first AE sensor) is in contact with the second member 16. The AE sensor 8 converts the vibration generated in the wafer W by polishing the wafer W into an electric signal via the suction mechanism 30 and the second member 16 and measures the electric signal.

The anti-vibration mechanism 20 includes a first through hole 20a through which the fastening member 18 penetrates. The anti-vibration mechanism 20 is provided, for example, between the fourth surface 32c of the top ring 32 and the first portion 16a of the second member 16. In this way, the anti-vibration mechanism 20 is fixed between the fourth surface 32c and the first portion 16a by the fastening member 18 penetrating the first through hole 20a.

Figure 8:
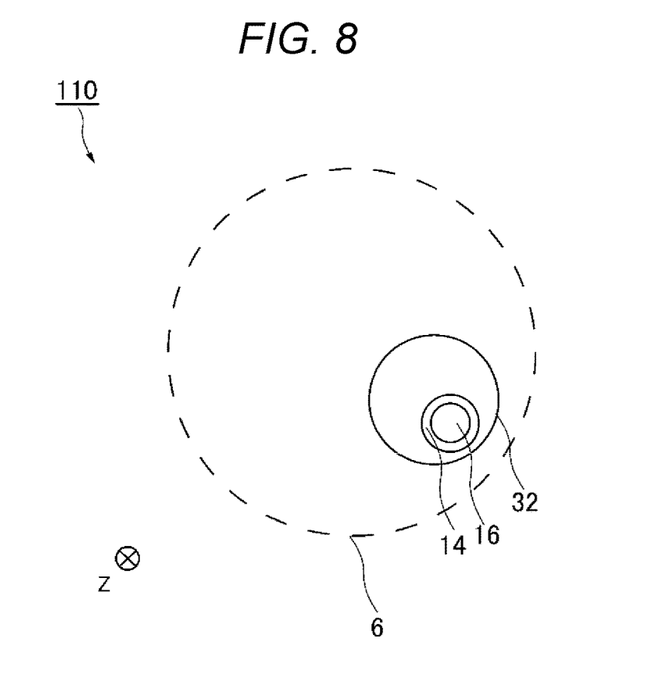
FIG. 8 is a schematic top view of the main part of the semiconductor manufacturing device according to the second embodiment.

FIG. 8 is a schematic bottom view of the semiconductor manufacturing device 110 according to the present embodiment. FIG. 8 is a diagram schematically illustrating the positional relationship between the turntable 6, the top ring 32, the first member 14, and the second member 16. In FIG. 8, the polishing pad 10, the top ring 32, and other members are not illustrated.

The AE sensor 8 may be provided on the top ring 32 as in the embodiment, or may be provided on the turntable 6 as in the first embodiment.

When the AE sensor 8 is provided on the turntable 6, the signal generated from the wafer W is measured via the polishing pad 10. The polishing pad 10 is made of polyurethane, for example. Thus, it is considered that the damping coefficient of the polishing pad 10 is larger than the damping coefficient of the metal member or the like. On the other hand, when the AE sensor 8 is provided on the top ring 32, the signal generated from the wafer W is measured via the suction mechanism 30. The suction mechanism 30 is formed of a metal such as SUS. Accordingly, it is considered that the damping coefficient of the suction mechanism 30 is relatively small. Thus, from this point of view, it is preferable to provide the AE sensor 8 on the top ring 32.

Next, the operation and effect of the semiconductor manufacturing device of the present embodiment will be described.

In the semiconductor manufacturing device 110, the second member 16 is in contact with the suction mechanism 30. Accordingly, the AE sensor 8 can measure, via the second member 16, the vibration generated by polishing the wafer W. The second member 16 is in contact with the top ring 32 via the first member 14. In other words, the second member 16 is not in direct contact with the top ring 32. As a result, the first member 14 hinders the arrival of the control signal or the like of the motor or the like to the AE sensor 8 via the top ring 32. This makes it possible to provide a semiconductor manufacturing device capable of accurately determining the polishing end point.

It is preferable that the second member 16 is fixed to the top ring 32 by the fastening member 18 including the second insulating material. Since the fastening member 18 contains the second insulating material, the transmission of the control signal or the like of the motor or the like from the top ring 32 to the second member 16 can be hindered.

The anti-vibration mechanism 20 containing rubber and having the first through hole 20a through which the fastening member 18 penetrates is provided, so that it is possible to hinder the vibration of the top ring 32 from being transmitted to the AE sensor 8.

It is preferable that the top ring 32 includes the fourth surface 32c facing the second surface 32a and the fourth through hole 32e through which the second surface 32a and the fourth surface 32c communicate with each other, a part of the first member 14 is provided in the fourth through hole 32e, and the second member 16 is in contact with the suction mechanism 30 via the third through hole 14b of the first member 14. According to such an aspect, it is possible to provide a semiconductor manufacturing device capable of accurately determining the polishing end point by hindering the transmission of the control signal or the like of the motor or the like.

It is preferable that the AE sensor 8 is in contact with the second member 16 provided in the second recess part 32b provided in the top ring 32. The vibration accompanying the polishing of the wafer W can be efficiently transmitted to the AE sensor by providing the second recess part 32b to reduce the thickness of the top ring 32 in the vicinity of the AE sensor 8.

According to the semiconductor manufacturing device of the present embodiment, it is also possible to provide a semiconductor manufacturing device capable of accurately determining the polishing end point.

Third Embodiment

A semiconductor manufacturing device of the present embodiment is different from the semiconductor manufacturing device of the first embodiment in the feature of further including a third member to come into contact with the turntable, a fourth member to come into contact with the polishing pad and with the turntable via the third member, and a second AE sensor to come into contact with the fourth member. Here, the description of the same content with those of the first embodiment and the second embodiment is omitted.

Figure 9:
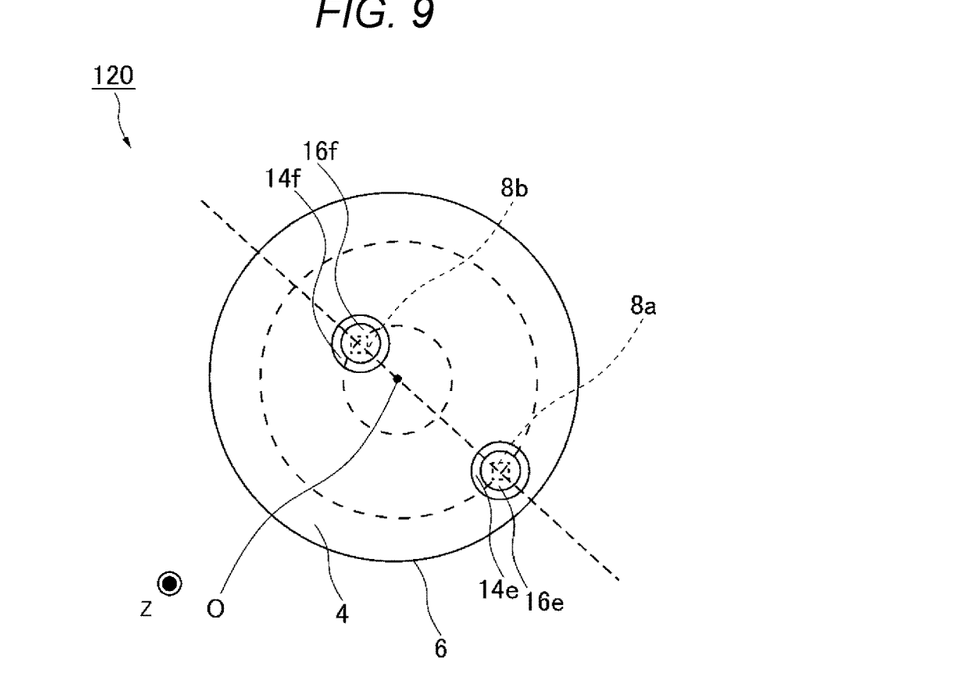
FIG. 9 is a schematic top view of a main part of a semiconductor manufacturing device according to a third embodiment.

FIG. 9 is a schematic top view of a main part of a semiconductor manufacturing device 120 according to the present embodiment. FIG. 9 is a diagram schematically illustrating the positional relationship between the first member 14, the second member 16, and the AE sensor 8 with respect to the turntable 6. In the semiconductor manufacturing device 120, a plurality of AE sensors 8 are provided on the turntable 6.

The semiconductor manufacturing device 120 includes a plurality of first members including a first member 14e and a first member 14f (an example of the third member). The semiconductor manufacturing device 120 includes a plurality of second members including a second member 16e and a second member 16f (an example of the fourth member). The semiconductor manufacturing device 120 further includes a plurality of AE sensors including an AE sensor 8a (an example of the first AE sensor) and an AE sensor 8b (an example of the second AE sensor). This makes it possible to detect polishing end points at a plurality of locations of the wafer W. Thus, the detection accuracy of the polishing end point can be improved.

In FIG. 9, the polishing pad 10 and other members are not illustrated.

In addition, in FIG. 9, a rotation center axis O of the turntable 6 is provided between the first member 14e, the second member 16e along with the AE sensor 8a, and the first member 14f, the second member 16f along with the AE sensor 8b. Nevertheless, the first member 14f, the second member 16f along with the AE sensor 8b may be provided between the rotation center axis O of the turntable 6 and the first member 14e, the second member 16e along with the AE sensor 8a.

Further, it is preferable that the distance between the rotation center axis O of the turntable 6 and the AE sensor 8a and the distance between the rotation center axis O of the turntable 6 and the AE sensor 8b in the plane parallel to the first surface 4 is different. This is because the different distances make it possible to measure polishing end points of a plurality of regions of the wafer W.

The distance between the rotation center axis O of the turntable 6 and the AE sensor 8a and the distance between the rotation center axis O of the turntable 6 and the AE sensor 8b in the plane parallel to the first surface 4 may be the same. This is because the number of measurements by the AE sensor 8 per unit time increases, so that the polishing end point can be measured more accurately.

According to the semiconductor manufacturing device of the present embodiment, it is also possible to provide a semiconductor manufacturing device capable of accurately determining the polishing end point.

Fourth Embodiment

A semiconductor manufacturing device of the present embodiment is different from the semiconductor manufacturing device of the second embodiment in the feature of further including a third member to come into contact with a top ring, a fourth member to come into contact with a suction mechanism and with the top ring via the third member, and a second AE sensor to come into contact with the fourth member. Here, the description of the same content with those of the semiconductor manufacturing devices according to the first to third embodiments is omitted.

Figure 10:
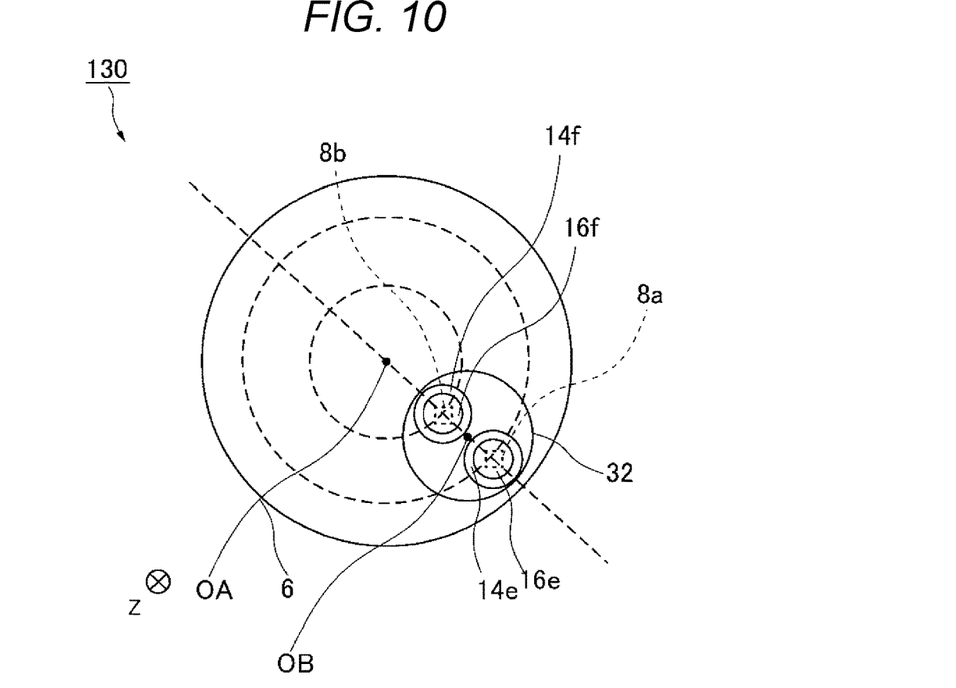
FIG. 10 is a schematic top view of a main part of a semiconductor manufacturing device according to a fourth embodiment.

FIG. 10 is a schematic top view of a main part of a semiconductor manufacturing device 130 according to the present embodiment. FIG. 10 is a diagram schematically illustrating the positional relationship between the first member 14, the second member 16, and the AE sensor 8 with respect to the turntable 6 and the top ring 32. A rotation center axis OA of the turntable 6 and a rotation center axis OB of the top ring 32 are also illustrated. In the semiconductor manufacturing device 130, a plurality of AE sensors 8 are provided on the top ring 32.

In FIG. 10, the polishing pad 10, the suction mechanism 30 and other members are not illustrated.

According to the semiconductor manufacturing device of the present embodiment, it is also possible to provide a semiconductor manufacturing device capable of accurately determining the polishing end point.

Fifth Embodiment

A semiconductor manufacturing device of the present embodiment is different from the semiconductor manufacturing device of the first embodiment in the feature that a first member is in contact with a turntable, a second member is in contact with a polishing pad and with the turntable via the first member, and the semiconductor manufacturing device further includes a third member to come into contact with a top ring, a fourth member to come into contact with a suction mechanism and with the top ring via the third member, and a second AE sensor to come into contact with the fourth member. Here, the description of the same content with those of the semiconductor manufacturing devices according to the first to fourth embodiments is omitted.

Figure 11:
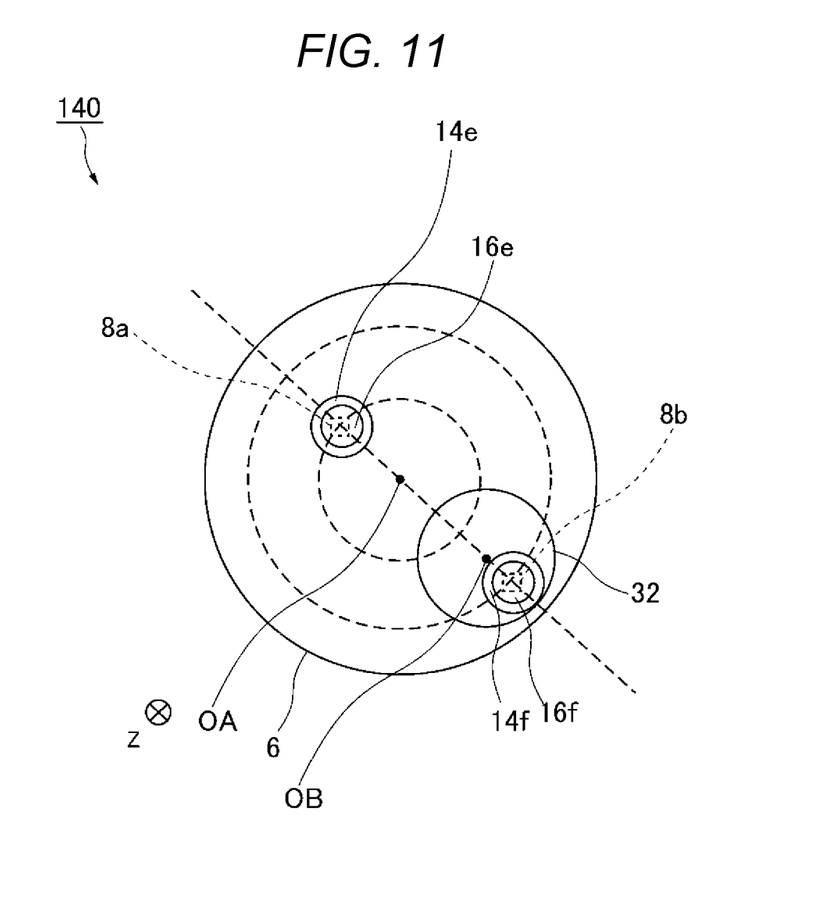
FIG. 11 is a schematic top view of a main part of a semiconductor manufacturing device according to a fifth embodiment.

FIG. 11 is a schematic view of a semiconductor manufacturing device 140 according to the present embodiment. FIG. 11 is a diagram schematically illustrating the positional relationship between the first member 14, the second member 16, and the AE sensor 8 with respect to the turntable 6 and the top ring 32. The first member 14e, the second member 16e, and the AE sensor 8a are provided on the turntable 6. The first member 14f (an example of the third member), the second member 16f (an example of the fourth member), and the AE sensor 8b (an example of the second AE sensor) are provided on the top ring 32. The rotation center axis OA of the turntable 6 and the rotation center axis OB of the top ring 32 are illustrated in FIG. 11.

In FIG. 11, the polishing pad 10, the suction mechanism 30 and other members are not illustrated.

Also according to the semiconductor manufacturing device of the present embodiment, it is possible to provide a semiconductor manufacturing device capable of accurately determining the polishing end point.

In the above embodiments, examples in which one AE sensor 8 or two AE sensors 8 are provided are described. However, the number of the AE sensors 8 in the semiconductor manufacturing device of the embodiments is, of course, not limited to one or two. In other words, in the semiconductor manufacturing device of the embodiments, three or more AE sensors 8 may be provided. For example, a time difference until the vibration of the wafer W reaches each of the three AE sensors is measured. Thus, it is possible to specify from which part of the wafer W the vibration is generated by using the time difference. In other words, it is possible to identify a point where the vibration of the wafer W is generated by using the time difference.

While certain embodiments and examples have been described, these embodiments and examples have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing device comprising:
   a turntable configured to rotate, the turntable having a first surface;
   a polishing pad disposed on the first surface;
   a first support portion configured to rotatably hold the turntable;
   a top ring having a second surface and including a suction mechanism that holds an object to be processed on the second surface;
   a second support portion configured to rotatably hold the top ring;
   a first member arranged to come into contact with the turntable or top ring;
   a second member arranged to come into contact with the polishing pad or suction mechanism and arranged to come into contact with the turntable or top ring via the first member; and
   a first acoustic emission (AE) sensor arranged to come into contact with the second member, wherein
   the turntable has a third surface facing the first surface, and a second through hole through which the third surface and the first surface communicate with each other,
   a part of the first member is provided in the second through hole, and
   the second member is in contact with the polishing pad via a third through hole of the first member.

2. The semiconductor manufacturing device according to claim 1, wherein the first member contains a first insulating material having an electric conductivity of $10^{-6}$ S/m or less.

3. The semiconductor manufacturing device according to claim 1, wherein a damping coefficient of the second member is 0.3 dB/(MHz·cm) or less.

4. The semiconductor manufacturing device according to claim 1, further comprising:
   a fastening member containing a second insulating material, wherein
   the second member is fixed to the turntable or the top ring with the fastening member.

5. The semiconductor manufacturing device according to claim 4, further comprising:
   an anti-vibration mechanism containing rubber and having a first through hole through which the fastening member penetrates, wherein
   the fastening member is a bolt.

6. The semiconductor manufacturing device according to claim 4, wherein the fastening member is one of a rivet or a bolt.

7. The semiconductor manufacturing device according to claim 1, wherein
   the first member is in contact with the turntable,
   the second member is in contact with the polishing pad and with the turntable via the first member, and
   the semiconductor manufacturing device further comprises:
   a third member arranged to come into contact with the turntable;
   a fourth member arranged to come into in contact with the polishing pad and with the turntable via the third member; and
   a second AE sensor arranged to come into contact with the fourth member.

8. The semiconductor manufacturing device according to claim 1, further comprising a slurry supply arranged to supply slurry to the polishing pad.

9. The semiconductor manufacturing device according to claim 1, further comprising a device management system configured to receive a signal from the AE sensor.

10. The semiconductor manufacturing device according to claim 1, wherein the semiconductor manufacturing device includes a chemical mechanical polishing device.

11. The semiconductor manufacturing device according to claim 1, wherein the turntable includes a first recess part facing the first surface of the turntable.

12. The semiconductor manufacturing device according to claim 1, wherein the second member is formed of metal.

13. The semiconductor manufacturing device according to claim 12, wherein the second member is formed of stainless used steel.

14. The semiconductor manufacturing device according to claim 1, wherein the polishing pad is formed of polyurethane.

* * * * *